(12) United States Patent
Wu et al.

(10) Patent No.: US 7,169,713 B2
(45) Date of Patent: Jan. 30, 2007

(54) ATOMIC LAYER DEPOSITION (ALD) METHOD WITH ENHANCED DEPOSITION RATE

(75) Inventors: Chih-Ta Wu, Hsinchu (TW); Kuo-Yin Lin, Dali (TW); Chia-Shiung Tsai, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 162 days.

(21) Appl. No.: 10/672,778

(22) Filed: Sep. 26, 2003

(65) Prior Publication Data

US 2005/0070041 A1    Mar. 31, 2005

(51) Int. Cl.
*H01L 21/31* (2006.01)
(52) U.S. Cl. .............. 438/765; 257/E21.461
(58) Field of Classification Search ........... 438/758, 438/765, 715; 118/715; 257/E21.461
See application file for complete search history.

(56) References Cited

U.S. PATENT DOCUMENTS

| 6,287,965 | B1 | 9/2001 | Kang et al. |
| 6,399,491 | B1 | 6/2002 | Jeon et al. |
| 6,916,398 | B1 * | 7/2005 | Chen et al. ............ 156/345.33 |
| 2002/0066411 | A1 * | 6/2002 | Chiang et al. ............... 118/724 |

\* cited by examiner

*Primary Examiner*—Bradley K. Smith
(74) *Attorney, Agent, or Firm*—Thomas, Kayden, Horstemeyer & Risley

(57) ABSTRACT

An atomic layer deposition method for forming a microelectronic layer employs a reactor chamber pressure of greater than about 500 mtorr and more preferably from about 20 to about 50 torr. By employing a reactor chamber pressure within the foregoing range, the microelectronic layer is formed with an enhanced deposition rate while employing the atomic layer deposition method, due to a gas phase chemical vapor deposition component to the atomic layer deposition method.

12 Claims, 3 Drawing Sheets

ATOMIC LAYER DEPOSITION (ALD) METHOD WITH ENHANCED DEPOSITION RATE

BACKGROUND OF THE INVENTION

1. Field of the Invention

The present invention relates generally to atomic layer deposition (ALD) methods for forming microelectronic layers. More particularly, the present invention relates to atomic layer deposition methods with enhanced deposition rates for forming microelectronic layers.

2. Description of the Related Art

Of the various methods that may be employed for forming microelectronic layers within microelectronic products, chemical vapor deposition (CVD) methods have become particularly common. Chemical vapor deposition methods provide for vapor phase reaction of a plurality of reactant materials such as to provide a vapor phase deposition of reacted reactant materials when forming a microelectronic layer.

Related to chemical vapor deposition methods are atomic layer deposition methods. Atomic layer deposition methods, which in turn are more closely related to digital (i.e., pulsed) chemical vapor deposition methods, provide for individually metered and discontinuous introduction of separate reactant gases into a reactor chamber. Within atomic layer deposition methods, a microelectronic layer is grown by deposition and/or reaction of atomic thickness layers adsorbed upon a substrate. Atomic layer deposition methods are often superior to conventional chemical vapor deposition methods insofar as they provide enhanced purity, enhanced step coverage, and enhanced thickness control of microelectronic layers.

Atomic layer deposition methods are nonetheless not entirely without problems.

In that regard, they typically suffer from generally low deposition rates, often in a range of less than about 10 angstroms per minute.

It is thus desirable within the microelectronic product fabrication art to provide atomic layer deposition methods with enhanced deposition rates.

The present invention is directed towards that goal.

SUMMARY OF THE INVENTION

A first object of the invention is to provide an atomic layer deposition method for forming a microelectronic layer within a microelectronic product.

A second object of the invention is to provide an atomic layer deposition method in accord with the first object of the invention, wherein the atomic layer deposition method is provided with an enhanced deposition rate.

In accord with the objects of the invention, the invention provides an atomic layer deposition method for forming a microelectronic layer.

The atomic layer deposition method of the invention first provides a substrate. A microelectronic layer is formed over the substrate while employing a deposition method that employs a separately pulsed introduction of a minimum of two reactant materials introduced into a reactor chamber. Within the invention, the reactor chamber is maintained at a pressure of greater than about 500 mtorr when forming the microelectronic layer.

The invention provides an atomic layer deposition method for forming a microelectronic layer with an enhanced deposition rate within a microelectronic product.

The invention realizes the foregoing object by undertaking the atomic layer deposition method within a reactor chamber maintained at a pressure of greater than about 500 mtorr.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The invention provides an atomic layer deposition method for forming a microelectronic layer with an enhanced deposition rate within a microelectronic product.

The invention realizes the foregoing object by undertaking the atomic layer deposition method within a reactor chamber maintained at a pressure of greater than about 500 mtorr.

The present invention provides particular value within the context of forming a conductor barrier layer for use as a capacitor plate layer within a capacitor within a microelectronic product. However, the invention is not intended to be so limited. Rather, the invention may be employed for forming, with enhanced deposition rate while employing an atomic layer deposition method, microelectronic layers including but not limited to conductor layers, semiconductor layers and dielectric layers.

Figure 1:
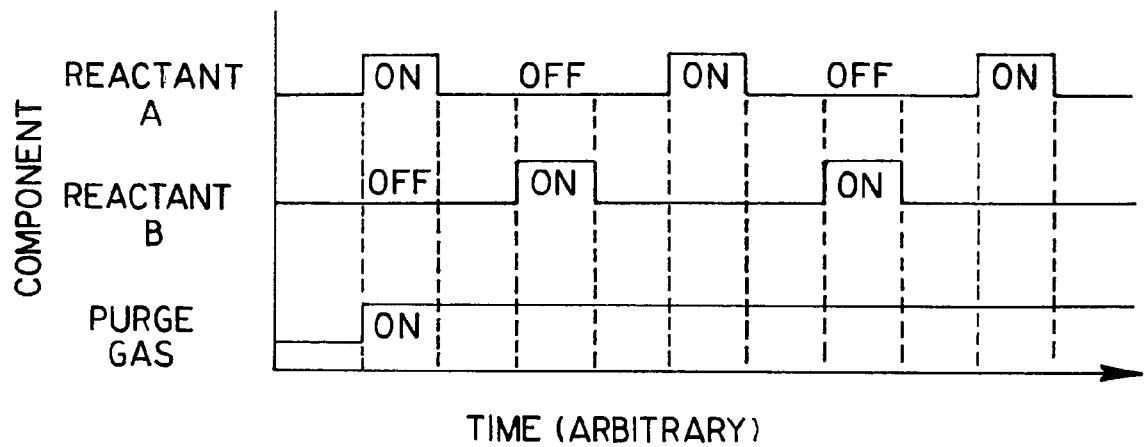
FIG. 1, FIG. 2 and FIG. 3 show a series of schematic reactant flow diagrams for a series of atomic layer deposition methods in accord with the present invention.
Figure 2:
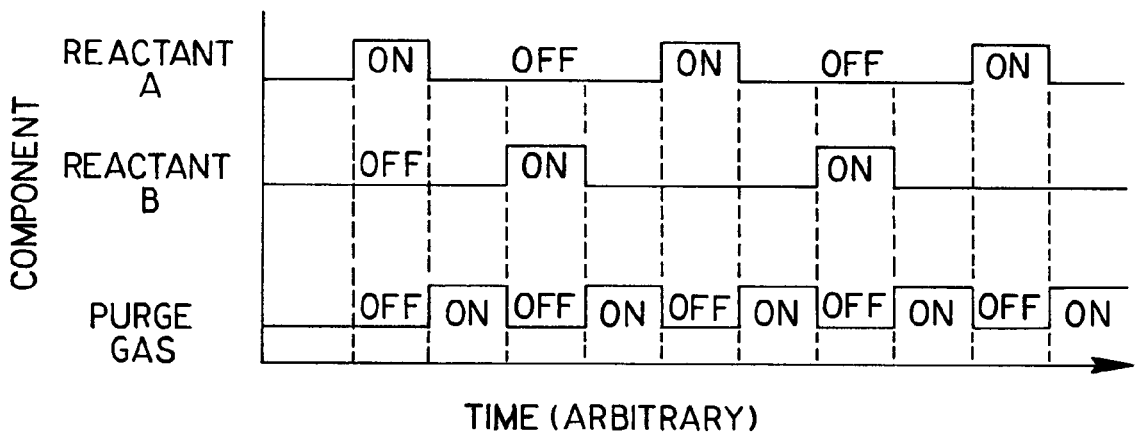
Figure 3:
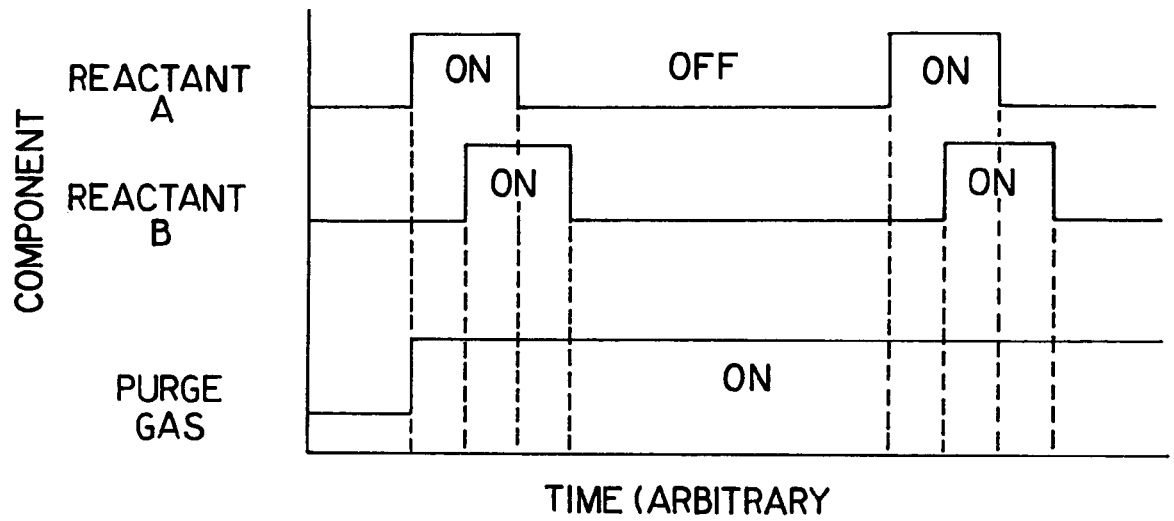

FIG. 1 to FIG. 3 show a series of schematic reactant flow diagrams for a series of atomic layer deposition methods that may be practiced in accord with the present invention.

FIG. 1 illustrates a reactant flow diagram where a first reactant gas A is alternately and sequentially digitally pulsed with a second reactant gas B, while a purge gas is continuously employed for removing excess concentrations of the first reactant gas A and the second reactant gas B. FIG. 2 shows a related reactant flow diagram where a purge gas is also pulsed, rather than being provided at a continuous flow rate as illustrated in FIG. 1. Finally, FIG. 3 also shows a reactant flow diagram related to FIG. 1, but where the pulsing of the first reactant gas A and the pulsing of the second reactant gas B overlap.

Within the invention, it expected that by employing a generally higher reactor chamber pressure when forming a microelectronic layer within a microelectronic product while employing an atomic layer deposition method in accord with the invention, the microelectronic layer is formed with an enhanced deposition rate. Within the invention, a generally higher reactant chamber pressure for forming a microelectronic layer is in a range of greater than 500 mtorr, more preferably greater than about 20 torr, still more preferably from about 20 to about 50 torr and most preferably from about 30 to about 50 torr. Typically, the enhanced deposition rate will be up to at least about 100 angstroms per minute, in comparison with an otherwise conventional deposition rate of less than about 10 angstroms per minute.

Within the invention, it is also expected or anticipated (without necessarily limiting the invention) that the increased reactor chamber pressure provides a gas phase chemical vapor deposition component to an atomic layer deposition method in accord with the invention. The gas phase chemical vapor deposition component provides the higher deposition rate. The gas phase chemical vapor deposition component derives from residual reactant gas components within a reactor chamber at the generally higher reactor chamber pressures in accord with the invention (i.e., in accord with FIG. 1–3 a concentration of reactant gas A or reactant gas B remains in the reactor chamber even though purged). The presence of residual reactant gases that presumably provide for the gas phase chemical vapor deposition component may also be effected by employing a shortened purge time (i.e., less than about 0.5 seconds or more preferably less than about 0.3 seconds, in comparison with a conventional purge time of about 1 second) within an atomic layer deposition method).

Within the invention, an increased reactor chamber pressure may be effected employing any of several methods. In particular, an increased reactor chamber pressure may be effected by controlling an extent of closure of a throttle valve within an atomic layer deposition apparatus. Alternatively, an increased reactor chamber pressure may be effected through use of a reactant and purge gas controller within the atomic layer deposition apparatus.

Figure 5:
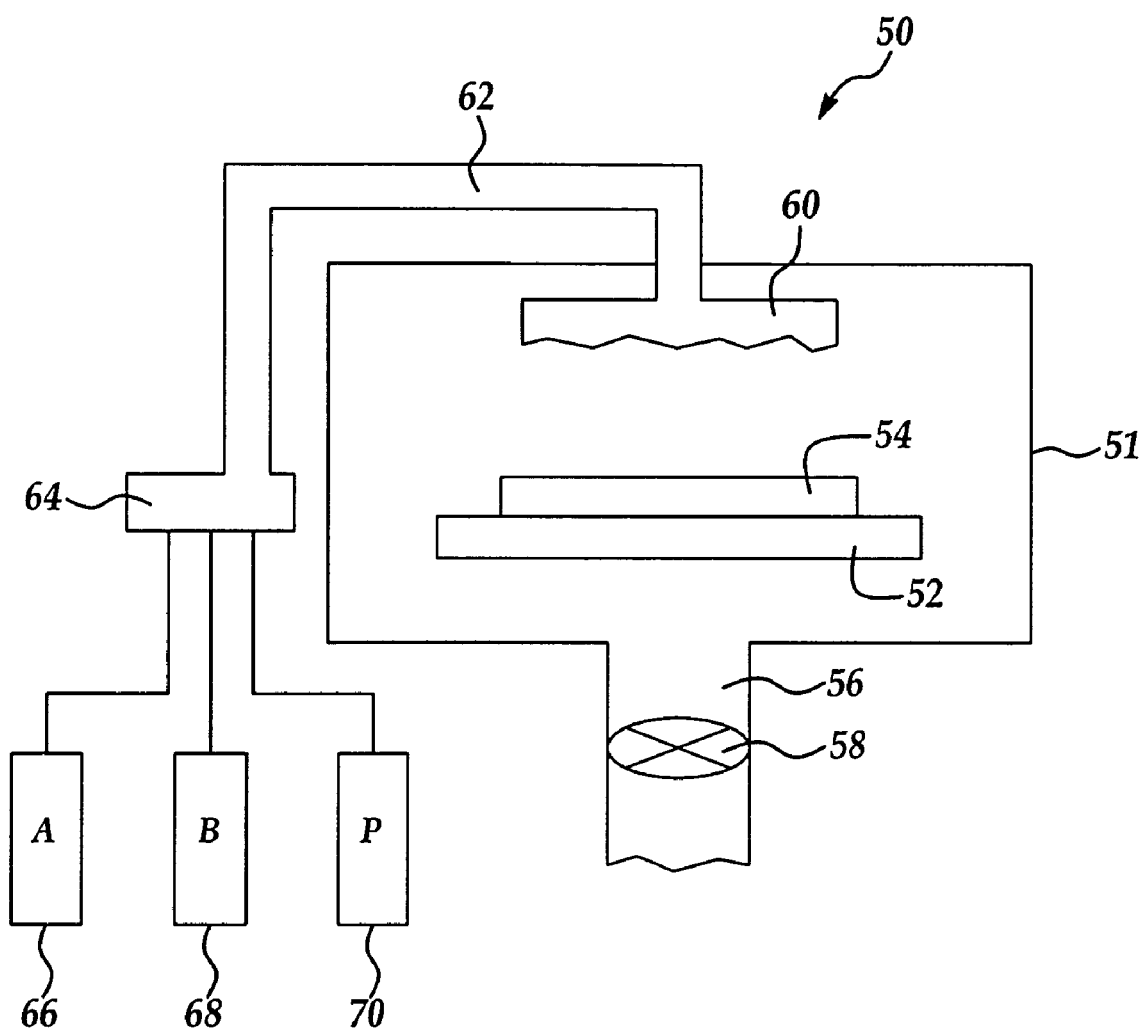
FIG. 5 shows a schematic diagram of an atomic layer deposition apparatus in accord with the invention.

FIG. 5 illustrates an atomic layer deposition apparatus. The atomic layer deposition apparatus 50 comprises an atomic layer deposition reactor chamber 51. A platen 52 is positioned within the atomic layer deposition reactor chamber 51, and a substrate 54 is positioned upon the platen 52. An exhaust 56 is connected to the atomic layer deposition reactor chamber 51 and a throttle valve 58 is positioned within the exhaust 56. As noted above, control of reactor chamber pressure within the atomic layer deposition reactor chamber 51 may be effected through control of the throttle valve 58.

A reactant gas A 66, a reactant gas B 68 and a purge gas 70 are supplied to the atomic layer deposition chamber 51 through a gas controller 64 that feeds a manifold 62 that in turn feeds a showerhead nozzle 60. The showerhead nozzle 60 provides the reactant gas A 66, the reactant gas B 68 and the purge gas P 70 in the vicinity of the substrate 54, thus providing for an atomic layer deposition method in accord with the invention. The gas controller 64 may also assist in providing reactor chamber pressure control within the atomic layer deposition reactor chamber 51.

Within the context of the present invention when the atomic layer deposition method is employed for forming a metal nitride layer for use as a barrier layer or a capacitor plate layer, the atomic layer deposition method also employs: (1) a metal source material (typically a metal chloride) flow rate of from about 5 to about 10 standard cubic centimeters per minute (sccm); (2) a nitride source material (typically ammonia) flow rate of from about 500 to about 1500 standard cubic centimeters per minute; (3) a purge gas (typically argon, helium or nitrogen) flow rate of from about 50 to about 150 standard cubic centimeters per minute; and (4) a substrate temperature of from about 400 to about 600 degrees centigrade. Typically, the atomic layer deposition method does not employ a plasma activation, although such is not precluded within the invention.

Figure 4:
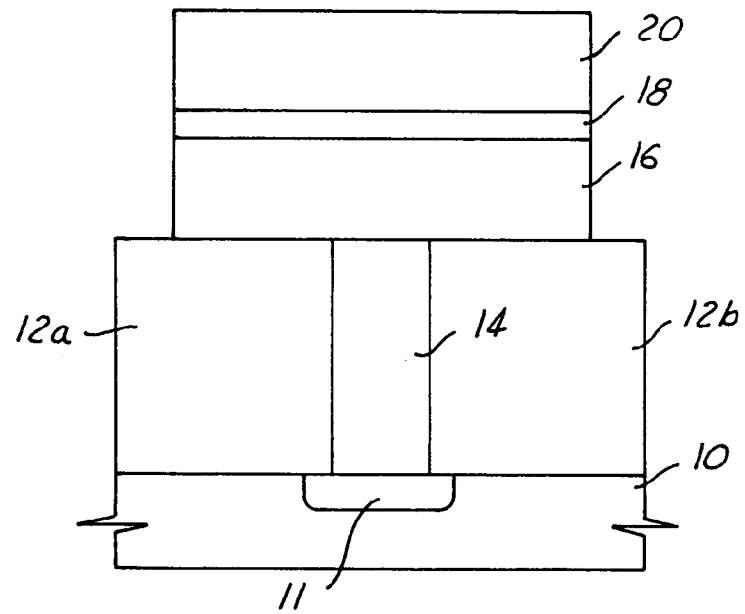
FIG. 4 shows a schematic cross-sectional diagram of a microelectronic product having formed therein a capacitor structure that may be formed employing an atomic layer deposition method in accord with the present invention.

FIG. 4 illustrates a microelectronic product having formed therein a capacitor structure which in part may be formed employing the atomic layer deposition method of the invention.

FIG. 4 illustrates a substrate 10. The substrate 10 has a contact region 11 formed therein.

Within the invention, the substrate 10 may be employed within a microelectronic product selected from the group including but not limited to integrated circuit products, ceramic substrate products and optoelectronic products. Although not specifically illustrated within the schematic cross-sectional diagram of FIG. 4, the substrate 10 may consist of a substrate alone as employed within the microelectronic product. In the alternative, the substrate 10 may comprise the substrate as employed within the microelectronic product, where the substrate has formed thereupon and or thereover any of several additional microelectronic layers as are conventional within the microelectronic product within which is employed the substrate. Such additional microelectronic layers may be formed from microelectronic materials selected from the group including but not limited to conductor materials, semiconductor materials and dielectric materials.

Although also not specifically illustrated within the schematic cross-sectional diagram of FIG. 4, the substrate 10, typically and preferably when the substrate 10 consists of a semiconductor substrate, has formed therein microelectronic devices as are conventional within the microelectronic product within which is employed the substrate 10. Such microelectronic devices may be selected from the group including but not limited to resistors, transistors, diodes.

Within the invention, the contact region 11 is typically and preferably either a semiconductor contact region (under circumstances where the substrate 10 consists of a semiconductor substrate), or a conductor contact region (under circumstances where the substrate is employed within any of the several microelectronic products described above).

FIG. 4 also shows a pair of patterned dielectric layers 12a and 12b formed upon the substrate 10 such as to define a via that exposes a portion of the contact region 11. FIG. 4 also illustrates a conductor stud layer 14 formed into the via.

Within the invention, the pair of patterned dielectric layers 12a and 12b may be formed of dielectric materials as are conventional in the microelectronic product fabrication art. Typically, each of the pair of patterned dielectric layers 12a and 12b is formed at least in part of a silicon oxide material formed to a thickness of from about 4000 to about 8000 angstroms. Within the invention, the conductor stud layer 14 is typically formed of a conductor material such as a metal, metal alloy, doped polysilicon (having a dopant concentration of greater than about 1E20 dopant atoms per cubic centimeter) or polycide (doped polysilicon/metal silicide stack) conductor material.

FIG. 4 also shows a capacitor structure formed upon the pair of patterned dielectric layers 12a and 12b and contacting the conductor stud layer 14. The capacitor structure comprises a first capacitor plate layer 16. A capacitor dielectric layer 18 is formed upon the first capacitor plate layer 16. A second capacitor plate layer 20 is in turn formed aligned upon the capacitor dielectric layer 18.

Within the invention, each of the first capacitor plate layer 16 and the second capacitor plate layer 20 is formed of a conductor barrier material formed employing an atomic layer deposition method with increased reactor chamber pressure in accord with the invention. Each of the first capacitor plate layer 16 and the second capacitor plate layer 20 may be formed from any of several conductor barrier materials, including in particular nitrides of titanium, tantalum, tungsten, zirconium, hafnium, molybdenum and niobium. For the preferred embodiment of the invention, each of the first capacitor plate layer 16 and the second capacitor plate layer 20 is formed of a titanium nitride conductor barrier material. Typically, each of the first capacitor plate layer 16 and the second capacitor plate layer 20 is formed to a thickness of from about 2000 to about 4000 angstroms while employing a titanium tetrachloride titanium source material, an ammonia nitrogen source material and an argon purge gas, in accord with the above flow rate limitations.

Within the invention, the capacitor dielectric layer 18 may be formed from any of several capacitor dielectric materials as are conventional in the microelectronic product fabrication art. Such capacitor dielectric materials may include, but not limited to: (1) generally lower dielectric constant dielectric materials (i.e., having a dielectric constant of less than about 10, such as silicon oxide dielectric materials and silicon nitride dielectric materials); and (2) generally higher dielectric constant dielectric materials (i.e., having a dielectric constant greater than about 10, such as tantalum oxide dielectric materials, barium strontium titanate dielectric materials and lead zirconate titanate dielectric materials).

FIG. 4 illustrates a capacitor structure within which may be formed a capacitor plate layer formed of a conductor barrier material while employing an atomic layer deposition method with an enhanced deposition rate.

The invention realizes the foregoing object by employing within the atomic layer deposition method at least either: (1) an increased reactor chamber pressure of greater than about 500 mtorr; or (2) a decreased purge time, such as presumably to provide for a gas phase chemical vapor deposition reaction component to the atomic layer deposition method.

As is understood by a person skilled in the art, the preferred embodiment of the invention is illustrative of the invention rather than limiting of the invention. Revisions and modifications may be made to methods, materials, structures and dimensions in accord with the preferred embodiment of the invention while still providing a method in accord with the invention, further in accord with the accompanying claims.

What is claimed is:

1. A method for increasing the deposition rate of an atomic layer deposition method comprising:
    positioning a substrate within an atomic layer deposition chamber;
    flowing a first reactant gas into the atomic layer deposition chamber such that the first reactant gas is adsorbed onto the substrate;
    flowing an inert gas into the atomic layer deposition chamber to substantially purge the interior of the chamber during a purge time, wherein the purge time is controlled to leave a residual portion of the first reactant gas; and
    flowing a second reactant gas into the atomic layer deposition chamber, where the second reactant gas reacts with both the first reactant gas adsorbed onto the substrate and the residual portion of the first reactant gas, thus forming a reacted material layer upon the substrate.

2. The method of claim 1 further comprising, after flowing the second reactant gas, flowing an inert gas into the atomic layer deposition chamber to substantially purge the interior of the reactor chamber during a purge time, wherein the purge time is controlled to leave a residual portion of the second reactant gas.

3. The method of claim 1 wherein the purge time is shortened to less than about 0.5 seconds.

4. The method of claim 1 wherein the purge time is shortened to less than about 0.3 seconds.

5. A method for forming a microelectronic layer comprising:
    providing a substrate;
    forming over the substrate a microelectronic layer while employing a deposition method which employs a separately pulsed introduction of a minimum of two reactant materials introduced into a reactor chamber; and
    flowing a purge gas into the reactor chamber to substantially purge the interior of the reactor chamber during a purge time, wherein the purge time is controlled to leave a residual portion of a first reactant material;
    where a second reactant material reacts with both the first reactant material adsorbed onto the substrate and the residual portion of the first reactant material within the reaction chamber, thus forming a reacted material layer upon the substrate.

6. The method of claim 5 wherein the deposition method employs a first pulsed reactant gas, a second pulsed reactant gas and a pulsed purge gas.

7. The method of claim 5 wherein the purge time is shortened to less than about 0.5 seconds.

8. The method of claim 5 wherein the purge time is shortened to less than about 0.3 seconds.

9. A method for forming a microelectronic layer comprising:
    providing a substrate;
    forming over the substrate a microelectronic layer while employing a deposition method which employs a separately pulsed introduction of a minimum of two reactant materials introduced into a reactor chamber and separated by employing a reactor chamber purge to flow a purge gas into the reactor chamber to substantially purge the interior of the reactor chamber during a purge time, wherein the purge time is controlled to leave a residual portion of a first reactant material;
    where a second reactant material reacts with both the first reactant material adsorbed onto the substrate and the resdual portion of the first reactant material within the reaction chamber, thus forming a reacted material layer upon the substrate.

10. The method of claim 9 wherein the disposition method employs a first pulsed reactant gas, a second pulsed reactant gas and a pulsed purge gas.

11. The method of claim 9 wherein the purge time is shortened to less than about 0.5 seconds.

12. The method of claim 9 wherein the purge time is shortened to less than about 0.3 seconds.

* * * * *